United States Patent [19]

Jacobs, deceased et al.

[11] Patent Number: 4,590,441

[45] Date of Patent: May 20, 1986

[54] FILTER REFLECTION IMAGE GUIDE OSCILLATOR AND SOLID STATE LINE SCANNING DEVICE

[75] Inventors: Harold Jacobs, deceased, late of West Long Branch, by Lydia S. Jacobs, executrix; Robert E. Horn, Middletown, both of N.J.

[73] Assignee: The United States of America as represented by the Secretary of the Army, Washington, D.C.

[21] Appl. No.: 679,970

[22] Filed: Dec. 10, 1984

[51] Int. Cl.$^4$ ............................................. H03B 5/36
[52] U.S. Cl. .................................. 331/107 DP; 331/96
[58] Field of Search ................. 331/86, 90, 96, 107 G, 331/107 DP, 107 R; 333/232, 235

[56] References Cited

U.S. PATENT DOCUMENTS 3,986,153  10/1976  Kuno ............................... 331/107 G

OTHER PUBLICATIONS

IEEE Transaction on Microwave Theory and Techniques, vol. MTT-30, No. 5, May 1982, R. E. Horn et al., "Single Frequency Electronic-Modulated Analog Lines Scanning Using a Dielectric Antenna", pp. 816-882.

IEEE Transactions on Microwave Theory and Techniques, vol. MTT-27, No. 5, May 1979, Tatsuo Itoh et al., "Distributed Bragg Reflector GUNN Oscillators for Dielectric Millimeter-Wave Integrated Circuits", pp. 514-518.

Primary Examiner—Eugene La Roche
Assistant Examiner—G. Wan
Attorney, Agent, or Firm—Anthony T. Lane; Jeremiah G. Murray; John T. Rehberg

[57] ABSTRACT

A filter reflection image guide oscillator and a line scanning device. The device includes a brass metal heat sink base on which a dielectric waveguide is mounted. A resonant cavity is defined in the dielectric waveguide and an oscillator diode, Gunn or IMPATT, for example, is located in the resonant cavity. The resonant cavity is enclosed by a metal cover with a post which is made to extend into the resonant cavity to contact one electrode of the oscillator diode. The top surface of the waveguide includes a perturbation surface consisting of parallel and spaced metal stripes which are laterally positioned along the length of the waveguide. The spacing of the metal stripes defines the function performed by the device. When the stripes are at $\frac{1}{2}\lambda_z$ spacings ($\lambda_z$ is the guide's longitudinal wavelength), a filter reflection image guide oscillator is provided and the perturbation surface is non-radiative. Only a small portion of the energy radiates out of the front of the waveguide. When the spacing is in the order of $\lambda_z \pm \Delta\lambda_z$, the perturbation surface becomes a radiating antenna and the radiation front leaves the pertubation surface at an angle with respect to the top surface. By changing the bias voltage of the oscillator diode or with the addition of a varactor with a separate DC bias source, the frequency in the waveguide can be changed and thus line scanning or beam steering is made possible.

21 Claims, 5 Drawing Figures

FILTER REFLECTION IMAGE GUIDE OSCILLATOR AND SOLID STATE LINE SCANNING DEVICE

The invention described herein may be manufactured, used and licensed by or for the Government without the payment to us of any royalty thereon.

BACKGROUND OF THE INVENTION

The present invention relates to filter reflection image guide oscillator and solid state line scanning device and more particularly to a diode oscillator which is located within a dielectric waveguide with spaced metal stripes on its upper side.

Microwave technology requires various circuit components for use in applications in the fields of radar and communications. Typically such circuit components include filter elements, oscillator sources, and/or scanning antennas for use in beam steering applications. While various circuits for the millimeter-wave applications have been described in the literature, there is an ongoing effort to provide simple and low cost devices which are able to perform several circuit functions in one integrated structure.

The present invention therefore provides a simple and low cost millimeter-wave device which can operate as either a filter reflection image guide oscillator or as a solid state line scanning device. The function of the device is determined by its structural characteristics and its operation can be controlled electronically.

SUMMARY OF THE INVENTION

The filter reflection image guide oscillator includes a metal base on which an elongated dielectric waveguide is located. The metal base, serving also as a heat sink for the oscillator, has an upper surface and a platform extension which protrudes longitudinally from the upper surface. The elongate dielectric waveguide is placed over the platform extension and over a portion of the metal base. A vertical hole or bore is provided in the waveguide to define a resonant cavity therein. The cavity penetrates through the waveguide and exposes the metal base below.

An oscillator diode with first and second electrical contact points is mounted inside the cavity and the diode is oriented so that its first contact point is connected to the metal base. The second electrical contact point faces upwards in the bore and is contacted by a post extending from a metal cover used for covering the bore. The post provides an electrical conductive path to the second contact of the diode.

A perturbation surface extends on the top surface of the elongate dielectric waveguide. The perturbation surface consists of spaced metal stripes which extend laterally (widthwise) to the longitudinal axis of the waveguide. The metal stripe spacing determines the function of the device. When the spacing is of the order of ($\frac{1}{2}$) $\lambda_z$ ($\lambda_z$ is the waveguide wavlength in the direction of propagation, and the spacings are measured from leading edge to leading edge of the metal stripes) the device is a filter reflection image guide oscillator.

The perturbation surface of a filter reflection image guide oscillator is non-radiative and appears as a high impedance filter to the oscillator. Consequently, the oscillator's "Q" and its stability are high and propagation of the millimeter-wave energy inside the waveguide is in the forward longitudinal direction of the waveguide and out of the front of the guide.

In a preferred embodiment, a back reflector is mounted behind the waveguide on the upper surface of the metal base. The back reflector reflects back millimeter-wave energy into the resonant cavity and serves to increase the "Q" and stability of the oscillator. A stand-off which is mounted in the metal base but which is insulated therefrom may be included to provide a DC bias power terminal for the top cover of the filter reflection oscillator.

The invention also shows that a waveguide can be of semiconductor material, for example silicon or gallium arsenide. It is also preferred that the oscillator diode is either a Gunn or IMPATT diode.

In another embodiment a solid state line scanning device is provided. The invention shows that by providing a metal stripe perturbation spacing which is on the order of one $\lambda_z$, the perturbation surface of the waveguide becomes an antenna aperture surface and millimeter-wave energy radiates from the guide's surface at an angle of $\theta \pm \Delta\theta$ ($\theta$ is measured with respect to the vertical). The actual angle of radiation is determined by the variance of the pertubation spacing from $\lambda_z$.

Since, however, the angle of radiation is related not only to the perturbation spacing but also to the frequency of oscillation, electronic scanning is possible through varying the frequency of oscillation. In one embodiment it is shown that the DC bias voltage of the oscillator diode can be varied to change the frequency of oscillation and to thus provide a frequency tunable beam steering device. In a further embodiment of the invention a varactor is placed adjacent the oscillator diode such that the millimeter-wave energy produced by the respective devices is combined to produce frequency tuning. This latter frequency tuning approach is advantageous in that the DC bias for the oscillator diode remains constant in order to optimize the power efficiency of the oscillator diode.

It is therefore an object of the invention to provide in one integrated package a filter reflection image guide oscillator.

It is another object of the invention to provide a solid state line scanning device.

It is a further object of the invention to provide a simple, low cost construction for a filter reflection image guide oscillator and solid state line scanning device.

It is still a further object of the invention to provide an electronically controllable beam steering device.

It is yet another object of the invention to provide a very stable filter reflection image guide oscillator having a very high "Q".

Other objects and features of the present invention will become apparent from the following description of preferred embodiments in conjunction with the accompanying drawings.

DETAILED DESCRIPTION OF THE DRAWINGS

The filter reflection image guide oscillator in accordance with the present invention will be described first by reference to FIGS. 1 and 2 wherein the filter type device is illustrated.

Figure 1:
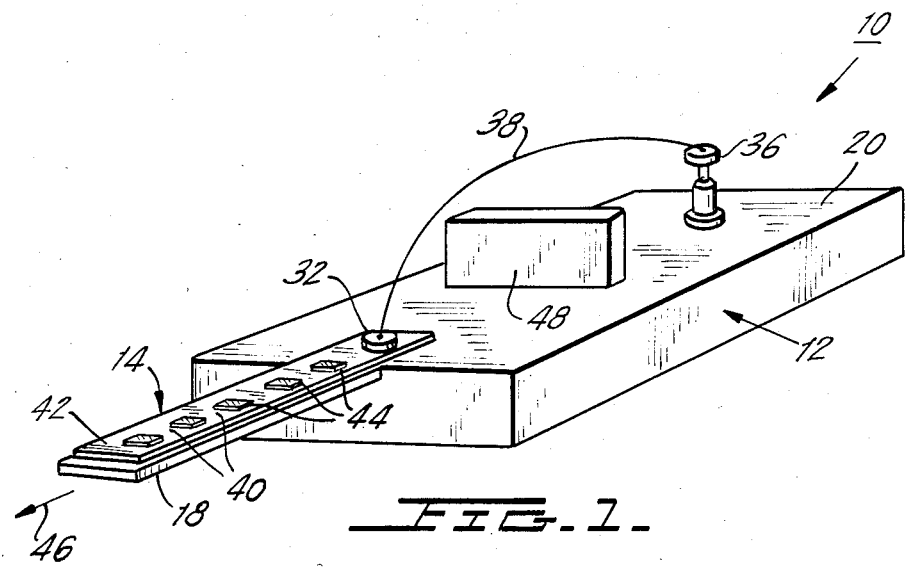
FIG. 1 is a perspective of an image guide oscillator with a perturbation surface with a spacing of ($\frac{1}{2}$) $\lambda_z$ in accordance with the present invention.

As shown in FIG. 1, the image guide oscillator 10, includes a metal base 12 and an image guide dielectric waveguide 14 which is mounmted atop the metal base 12. As best seen in FIG. 2, the metal base 12 consists of a main heat sinking rectangular section 16 and a platform extension 18 which extends from the top surface 20 of the metal base 12. The platform extension 18 extends along the longitudinal direction of the metal base and is narrower in width than the main heat sinking section 16 of the metal base.

The dielectric waveguide 14 is a generally rectangularly shaped flat elongated slab of semiconductor material, preferably silicon or gallium arsenide, which is cemented to the top surface 20 of the metal base 12 and extends along the platform extension 18 and along a portion of the top surface 20.

A waveguide vertical bore 22 (FIG. 2) is defined in the dielectric waveguide 14 which exposes a portion of the top surface 20 of the metal base beneath the waveguide 14. A threaded metal base bore 24 is defined in the metal base beneath the waveguide bore 22 and an oscillator diode support structure 26 is threaded into the metal base bore 24. The oscillator diode support 26 includes a threaded stem 28 which is received in the metal base bore 24 and a diode platform 30 on which a diode 90 is mounted.

A metal cover 32 in the shape of a cylindrical disk with a post 34 depending perpendicularly therefrom is provided for enclosing the bore 22 of the waveguide 14. The enclosed waveguide bore 22 defines a resonant cavity in which sustained oscillations are triggered by the oscillator diode 90 within the resonant cavity 22.

The oscillator diode 90 includes a first and second electrical contacts to which a DC bias source must be connected. The first contact is connected to the diode support structure 26. The diode support structure 26 is electrically connected to the metal base 12 which is in turn connected to a first terminal of a DC bias source (not shown). The post 34 of the metal cover 32 is electrically connected to the second electrical contact of the diode 90. The metal cover 32 may be connected to a second terminal of a DC bias source directly.

Figure 2:
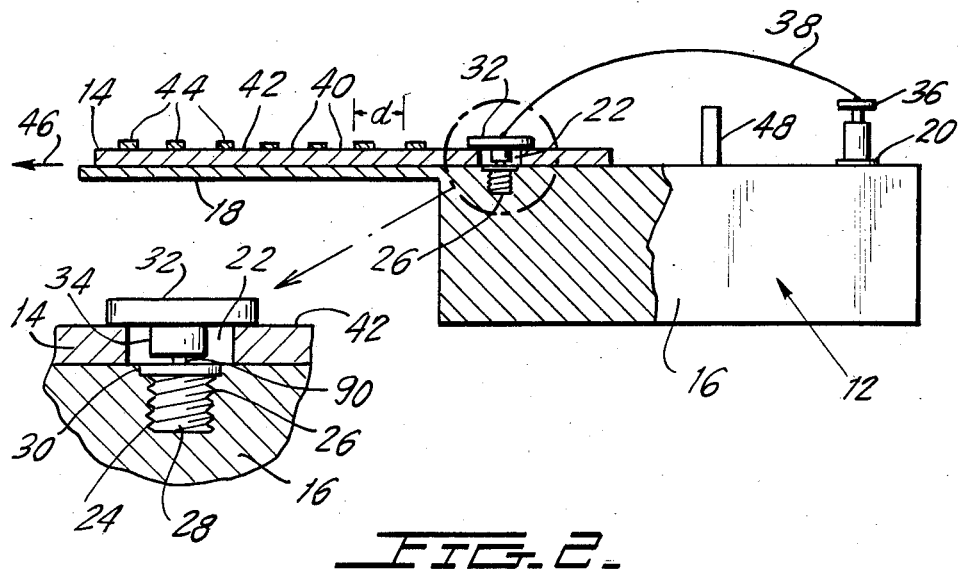
FIG. 2 is a side elevation cross-section of the embodiment of FIG. 1.

Alternately, a standoff 36 is provided as shown in FIG. 2. The standoff 36 is mounted atop the metal base 12 but is electrically insulated therefrom. It serves as a terminal post for the second terminal of the DC bias source. A bias wire 38 is employed for connecting the standoff 36 to the metal cover 32. When the oscillator diode is electrically energized, millimeter-wave energy oscillations are set up in the resonant cavity 22 and in the waveguide 14.

To obtain a filter reflection image guide oscillator in accordance with the present invention, a perturbation surface 40 is defined along a portion of the top surface 42 of the waveguide 14. The perturbation surface 40 consists of parallel and spaced metal stripes 44 (or a metal grate) which are included along the portion of the waveguide 14 and extending forwardly of the waveguide bore 22. The spacing "d" of the metal stripes 44 determines the function of the image guide oscillator 10. When the spacing between leading edges of adjacent metal stripes is one-half $\lambda_z$, where $\lambda_z$ is the wavelength in the waveguide itself, the perturbation surface 40 is non-radiative and appears as a high impedance to the oscillator.

In a non-radiative oscillator, millimeter-wave energy does not escape through the top surface of the waveguide but rather is reflected back toward the resonant cavity 22. At an oscillator frequency where the waveguide wavelength is one-half $\lambda_z$, both the oscillator circuit "Q" and the stability of the oscillator are high. Under such circumstances, propogation of millimeter-wave energy proceeds along the longitudinal direction of the waveguide and is reflected back into the waveguide. Only a small portion of the millimeter-wave energy is radiated in the direction of arrow 46 of the filter. Thus, a filter reflection image guide oscillator is obtained.

In order to further improve the "Q" and the stability of the oscillator, a back reflector 48 comprising a solid structure which is positioned behind the waveguide as shown in FIGS. 1 and 2 is provided. The back reflector 48 operates to reflect back into the oscillator's resonant cavity 22 millimeter-wave energy which escapes from the waveguide in a direction toward the back reflector 48. Thus, with the filter reflection image guide oscillator as described above, a combined oscillator and filter with a higher "Q" and a more stable output is obtained.

Figure 3:
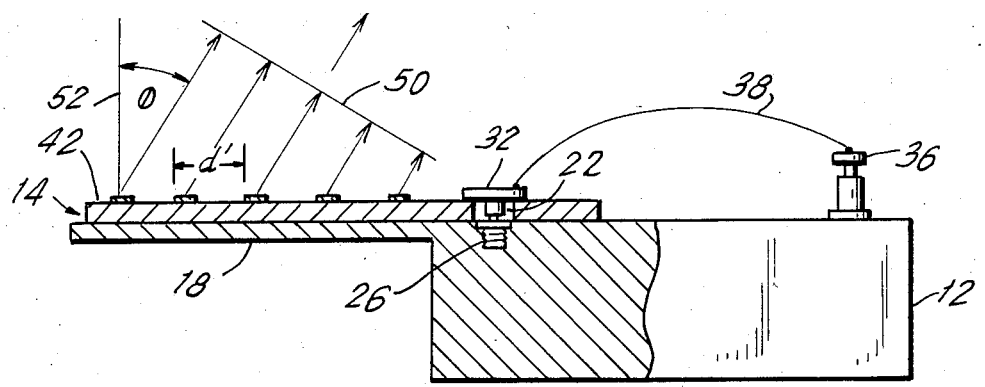
FIG. 3 is a second embodiment of the basic device shown in FIGS. 1 and 2 in which a different perturbation spacing is provided in order to produce a line scanning type image guide oscillator.

The perturbation surface 40 of the filter reflection image guide oscillator described above can be made into an antenna aperture surface which radiates millimeter-wave energy by changing the spacing "d" in FIG. 2 to a spacing "d'" as shown in FIG. 3. If the perturbation spacing "d'" in FIG. 3 is in the order of one $\lambda_z$ or a small deviation therefrom, a radiation front 50 is generated as shown in FIG. 3. The radiation front 50 is directed at an angle $\theta$ with respect to a vertical line 52 which is normal to the top surface of the waveguide 14. The actual angle of radiation of $\theta$ is defined by a relationship well known to those skilled in the art, for example, in A. Hessel, "General Characteristics of Traveling Wave Antennas," in Antenna Theory (Part 2), Collins and Zucker, Eds. New York: McGraw Hill, 1969.:

$$\sin\theta = (\lambda_o/\lambda_z) + n(\lambda_o/d')$$

wherein n= −1 (spatial harmonic); d'=perturbation spacing (leading edge to leading edge); $\lambda_O$=the free space wavelength at the oscillation frequency; $\lambda_z$=the waveguide wavelength in the direction of propagation.

Therefore, by a judicious spacing of the metal stripes 44, the angle of radiation can be set. The angle of radiation $\theta$ may be changed either by changing the spacing d' between the metal stripes 44 or by changing the oscillation frequency in the resonant cavity 22. Since the resonant frequency can be changed electronically, as will be described below, a line scanning antenna or beam steering is made possible. It will be noted that for this line scanning application, a back reflector 48 as previously provided is not necessary. In many other respects, the devices are identical in that the metal base 12 is comprised of brass material and the waveguide is preferably of silicon or gallium arsenide material and the oscillator diode is either a Gunn or IMPATT diode.

To electronically steer the radiation front 50 from the top surface of the waveguide, the frequency of oscillation in the resonant cavity 22 is changed. One method for changing the frequency is by changing the bias the current through the oscillator diode located in the resonant cavity 22. The changing bias current will change the frequency and hence the value $\lambda_z$ and the angle of radiation $\theta$. However, this method of electronic frequency tuning is undesirable because changing the DC bias current of the oscillator diode may reduce the power output of the device and hence its efficiency.

Figure 5:
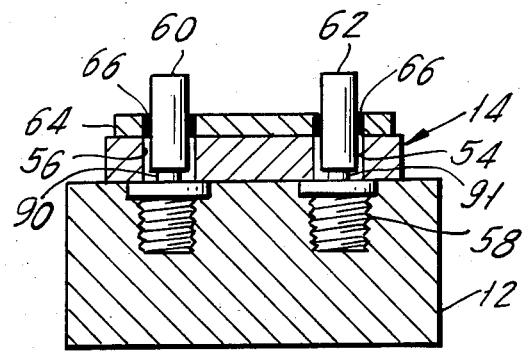
FIG. 5 is a view of FIG. 4 along lines 5—5.
Figure 4:
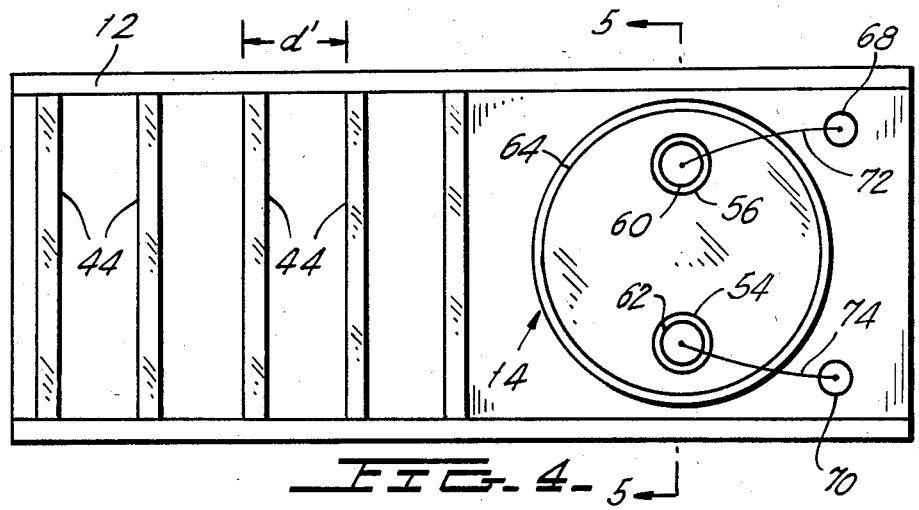
FIG. 4 is a top view of an image guide oscillator which includes a varactor for frequency tuning and which comprises a modification to the embodiment of FIG. 3.

An alternate means for changing the frequency in the line scanning device in accordance with the present invention is shown in FIGS. 4 and 5 of the drawings. As shown in these figures, a varactor cavity 54 is defined adjacent an oscillator resonant cavity 56 to achieve electronic frequency tuning without affecting the power output of the line scanning device. In the varactor cavity 54, a varactor support structure 58 is positioned in the metal base and a varactor 91 is supported on top of the varactor support structure 58. The oscillator resonant cavity 56 corresponds to the resonant cavity 22 shown in FIGS. 2 and 3. In both the oscillator resonant cavity 56 which includes a Gunn or IMPATT diode oscillator or in the varactor cavity 54, respective posts 60 and 62 are provided for contacting electrically one electrical contact of the oscillator or varactor to provide a DC bias source thereto. The varactor DC bias is thus independent of the DC bias voltage which is applied to the oscillator diode.

The varactor diode 91 provides a capacitance which varies as the voltage applied to it is varied and hence reacts with the Gunn (or IMPATT) diode through the electromagnetic field generated by the oscillations of the Gunn (or IMPATT) diode oscillator to change the oscillator resonant frequency. With this method, the bias voltage on the oscillator diode 90 is maintained constant and power output from the waveguide is not altered. The posts 60 and 62 of the oscillator diode 90 and the varactor 91 respectively are insulated from the metal cover 64 with thin concentric insulators 66.

FIG. 4 shows further that the line scanning oscillator 10 may include dual standoffs 68, 70 and corresponding thin wires 72 and 74 to separate the DC bias voltages of the oscillator diode and the varactor.

Thus, in accordance with the present invention, it has been shown that a image guide oscillator located in a resonant cavity of a dielectric image waveguide can be provided with a perturbation surface consisting of metal stripes whose spacing determines whether the device acts as a reflection filter or as a radiating line scanning antenna.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. An image guide oscillator device, comprising:
    a metal base;
    a semiconductor waveguide mounted atop said metal base, said waveguide having a resonant cavity defined therein, and exposing a portion of said metal base;
    an adjustable oscillator means mounted atop said metal base and disposed within said resonant cavity for generating variable electromagnetic waves along the length of said waveguide: and
    a plurality of evenly spaced metal perturbations positioned transversely atop said semiconductor waveguide.

2. A device as recited in claim 1, wherein said device is a filter reflection image guide oscillator, and
    said metal base includes an upper surface and a platform extension longitudinally depending from said upper surface;
    said semiconductor waveguide has a front end extending along said platform extension and a back end extending longitudinally from said front end and covering a portion of said metal base adjacent said platform extension, said resonant cavity being defined by a bore through said waveguide which reaches and exposes a portion of said upper surface of said metal base, said waveguide having a waveguide wavelength of $\lambda_z$;
    said oscillator includes a diode mounted at said upper surface of said metal base in said bore;
    a metal cover is positioned atop said resonant cavity, and
    said metal perturbations extend along said front end of said waveguide on the top surface thereof at one-half $\lambda_z$ spaced intervals thereof, said stripes causing substantial reflection of said electromagnetic waves within said waveguide.

3. The device of claim 2 further comprising a back reflector mounted at said upper surface of said metal base longitudinally behind said back end of said waveguide.

4. The device of claim 3, wherein said metal cover includes a post perpendicularly depending from said metal cover and extending into said bore to reach said diode, said diode having a first electrical contact and a second electrical contact, said first contact being conductive to said metal base, said second contact being conductive to said post.

5. The device of claim 4 further comprising a standoff insulated from said metal base and a thin electrical conductor extending from said standoff to said metal cover.

6. The device of claim 4, wherein said metal base is a brass metal base.

7. The device of claim 6, wherein said waveguide is a silicon waveguide.

8. The device of claim 6, wherein said waveguide is a gallium arsenide waveguide.

9. The device of claim 6, wherein said oscillator diode is a Gunn diode.

10. The device of claim 6, wherein said oscillator diode is an IMPATT diode.

11. A device as recited in claim 1 wherein said device is a solid state line scanning image guide oscillator with an antenna aperture surface for radiating millimeter-wave energy at a selected angle of radiation with respect to said surface, and
    said metal base includes an upper surface and a platform extension longitudinally depending from said upper surface;
    said semiconductor waveguide has a front end extending along said platform extension and a back end extending longitudinally from said front end and covering a portion of said metal base adjacent said platform extension, said resonant cavity being defined by a bore through said waveguide which reaches and exposes a portion of said upper surface of said metal base, said waveguide having a waveguide wavelength of $\lambda_z$;

said oscillator includes a diode mounted at said upper surface of said metal base in said bore; a metal cover is positioned atop said resonant cavity, and said perturbations extend along said front end of said waveguide on the top surface thereof at spaced intervals, said spaced intervals determining an angle of radiation $\theta$, said angle of radiation being measured from the normal to said top surface and being related to said spacing by the equation:

$$\sin \theta = (\lambda_o/\lambda_z) + n(\lambda_o/d')$$

in which $n = -1$ (spatial harmonic, $d' =$ perturbation spacing (leading edge to leading edge), $\lambda_O =$ free space wavelength, and $\lambda_z =$ the waveguide wavelength in direction of propagation, said $d'$ being equal to $\lambda_z$, $\pm a\lambda_z$.

12. The device of claim 11, wherein said metal cover includes a post depending perpendicularly from said cover and extending into said bore to reach said oscillator diode, said oscillator diode having a first electrical contact and a second electrical contact, said first contact being conductive to said metal base and said second contact being conductive to said post.

13. The device of claim 12 further comprising a standoff insulated from said metal base, and a thin electrical conductor extending between said standoff and said metal cover.

14. The device of claim 12, wherein said metal base is a brass metal base.

15. The device of claim 12, wherein said waveguide is a silicon dielectric waveguide.

16. The device of claim 12, wherein said waveguide is a gallium arsenide dielectric waveguide.

17. The device of claim 12, wherein said oscillator diode is a Gunn diode.

18. The device of claim 12, wherein said oscillator diode is an IMPATT diode.

19. The device of claim 12 further comprising a DC bias source for providing a voltage and current for said oscillator and DC bias adjusting means for adjusting said DC bias source to change the frequency of said oscillator whereby said angle of radiation is changed.

20. The device of claim 12 further comprising frequency changing means positioned in said waveguide adjacent said oscillator diode for changing the frequency of said oscillation of said waveguide to change said angle of radiation.

21. The device of claim 20, wherein said frequency changing means comprises a varactor and independent DC bias means for said varactor.

* * * * *